United States Patent [19]

Borth et al.

[11] Patent Number: 4,723,288
[45] Date of Patent: Feb. 2, 1988

[54] STEREO DECODING BY DIRECT TIME SAMPLING

[75] Inventors: David E. Borth, Palatine; Kevin L. Kloker, Arlington Heights; James J. Mikulski, Deerfield, all of Ill.

[73] Assignee: Motorola, Inc., Schaumburg, Ill.

[21] Appl. No.: 882,111

[22] Filed: Jul. 3, 1986

[51] Int. Cl.⁴ ............................................. H04H 5/00
[52] U.S. Cl. ..................................... 381/7; 329/126
[58] Field of Search ......................... 381/2, 3, 4, 7; 329/126

[56] References Cited

U.S. PATENT DOCUMENTS 4,194,161  3/1980  Hershberger ..................... 381/7
4,489,430  12/1984  Ishida et al. ..................... 381/7
4,502,148  2/1985  Ishida et al. ..................... 381/7

OTHER PUBLICATIONS

Berlin, Design of Phase-Locked Loops, with Experiments, 1980, pp. 26-27.

Primary Examiner—Forester W. Isen
Attorney, Agent, or Firm—John A. Fisher; Jeffrey Van Myers; Robert L. King

[57] ABSTRACT

A stereo decoder is provided for decoding an encoded stereo signal. In one form, the encoded stereo signal is digitized and coupled to two sampling circuits. By selectively sampling the encoded signal relative to a stereo pilot signal contained in the encoded signal, both a left-hand audio signal and a right-hand audio signal may be separately recovered from the encoded signal and latched. A phase locked loop monitors the phase of the stereo pilot signal relative to the encoded signal and controls the time sampling of the encoded signal at predetermined phases of the pilot signal. The stereo decoding may also be performed by using analog circuitry to directly time sample the encoded stereo signal. In an analog approach, the time sampled output signal must be low pass filtered to provide decoded stereo output signals.

9 Claims, 4 Drawing Figures

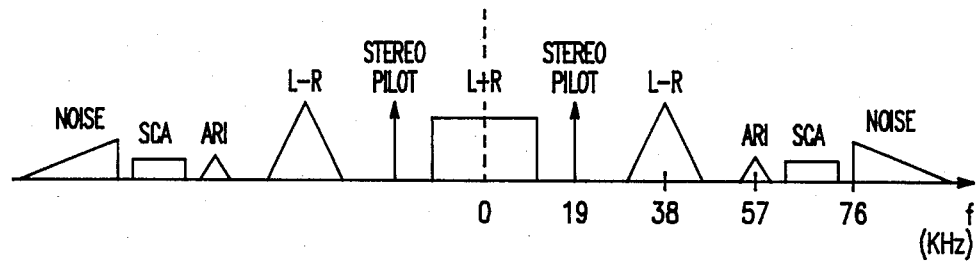
FIG. 1
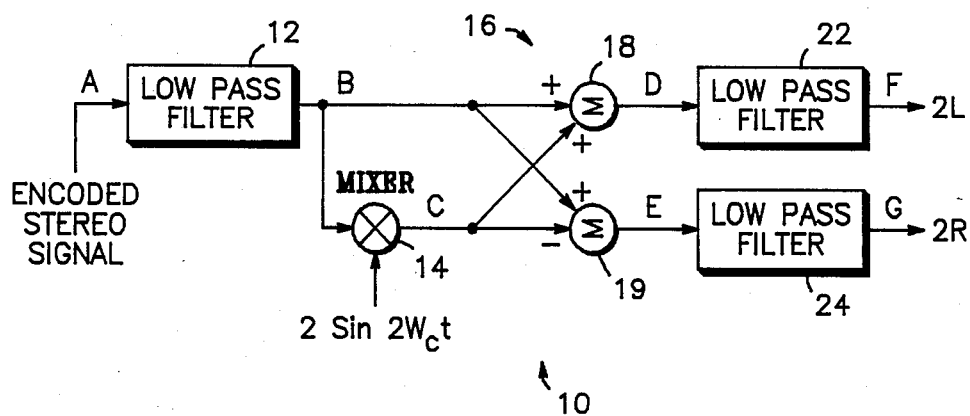
FIG. 2
—PRIOR ART—
FIG. 3
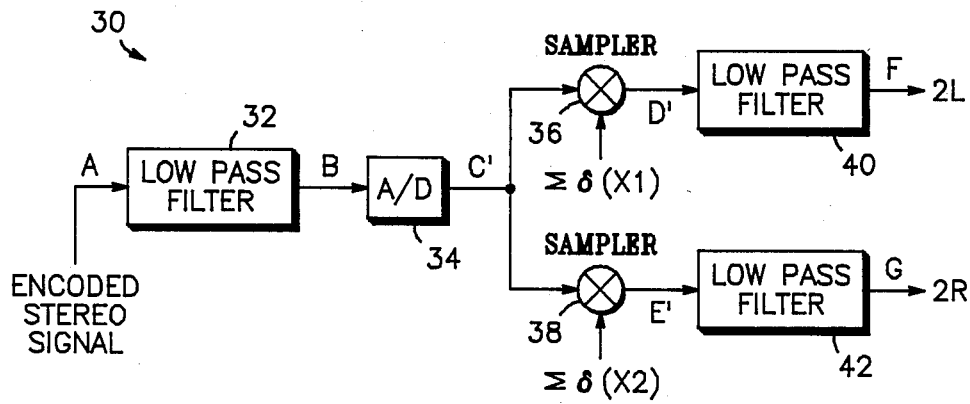

STEREO DECODING BY DIRECT TIME SAMPLING

TECHNICAL FIELD

This invention relates generally to decoding of signals in a receiver, and more particularly, to demodulation of encoded signals in broadcast receivers.

BACKGROUND ART

In FM stereo broadcasting, an FM transmitter produces and transmits a stereo signal which contains a left-hand audio signal and a right-hand audio signal among various other frequency components. Stereo receivers recover the encoded stereo signal from a frequency modulated carrier and decode the stereo signal to recreate the left-hand audio and right-hand audio signals. Typically, the components of the encoded stereo signal are provided by filters as noted in *Principles of Communication Systems* by Herbert Taub and Donald L. Schilling (McGraw-Hill Book Company, 1971, pages 146–151). Included in the components of the encoded signal is a pilot carrier signal, a waveform proportional to the sum of the left-hand and right-hand audio signals, and a double-sideband suppressed-carrier waveform proportional to the difference of the left-hand and right-hand audio signals. The pilot carrier signal may be easily filtered and modified to recreate a subcarrier frequency which allows synchronous demodulation of the double sideband suppressed-carrier waveform to provide a difference waveform. A baseband filter provides a sum waveform so that the sum and difference signals may be respectively added and subtracted to decode the left-hand audio and right-hand audio signals.

Previous FM stereo decoders have typically been implemented with analog circuitry. When FM stereo receivers are implemented with analog circuitry, frequency drifts associated with changing age of the circuitry and temperature variations cause the quality of reception to vary. Further, analog FM receivers typically have a plurality of filters associated therewith for implementing the various frequency translations required to decode an FM signal as described above.

BRIEF DESCRIPTION OF THE INVENTION

Accordingly, an object of the present invention is to provide an improved system for decoding an encoded signal containing first and second signals by direct time sampling.

Another object of the present invention is to provide an improved method of decoding an encoded signal containing first and second signals.

A further object of the present invention is to provide an improved digital technique for FM stereo decoding.

Yet another object of the present invention is to provide improved stereo separation and frequency response in an FM stereo receiver.

Yet a further object of the present invention is to provide an improved method of FM stereo decoding which minimizes frequency reception drift resulting from temperature variations and age deterioration of electrical components.

In carrying out the above and other objects of the present invention, there is provided, in one form, a decoder for decoding an encoded signal to provide first and second output signals. The encoded signal contains first and second component signals where the first component signal has a first predetermined center frequency and is proportional to a sum of the first and second output signals. The second component signal has a second predetermined center frequency and is proportional to a difference of the first and second output signals. The invention may be implemented in either a digital or an analog form. In a digital form, the encoded signal is digitized and direct time sampled at a predetermined sample frequency which is phase locked to the second predetermined center frequency of the second component signal to provide the first and second output signals. In an analog form, the encoded signal is received and direct time sampled at a predetermined sample frequency which is phase locked to the second predetermined center frequency of the second component signal to provide first and second sample signals. The first and second sample signals are low pass filtered to provide the first and second output signals.

These and other objects, features and advantages will be more clearly understood from the following detailed description taken in conjunction with the accompanying drawings.

BRIEF DESCRIPTION OF THE DRAWINGS

FIG. 1 illustrates in graphical form a frequency plot of a conventional encoded stereo signal;

FIG. 2 illustrates in block diagram form an FM stereo decoder known in the art;

FIG. 3 illustrates in block diagram form an FM stereo decoder in accordance with the present invention.

DETAILED DESCRIPTION OF THE INVENTION

Figure 4:
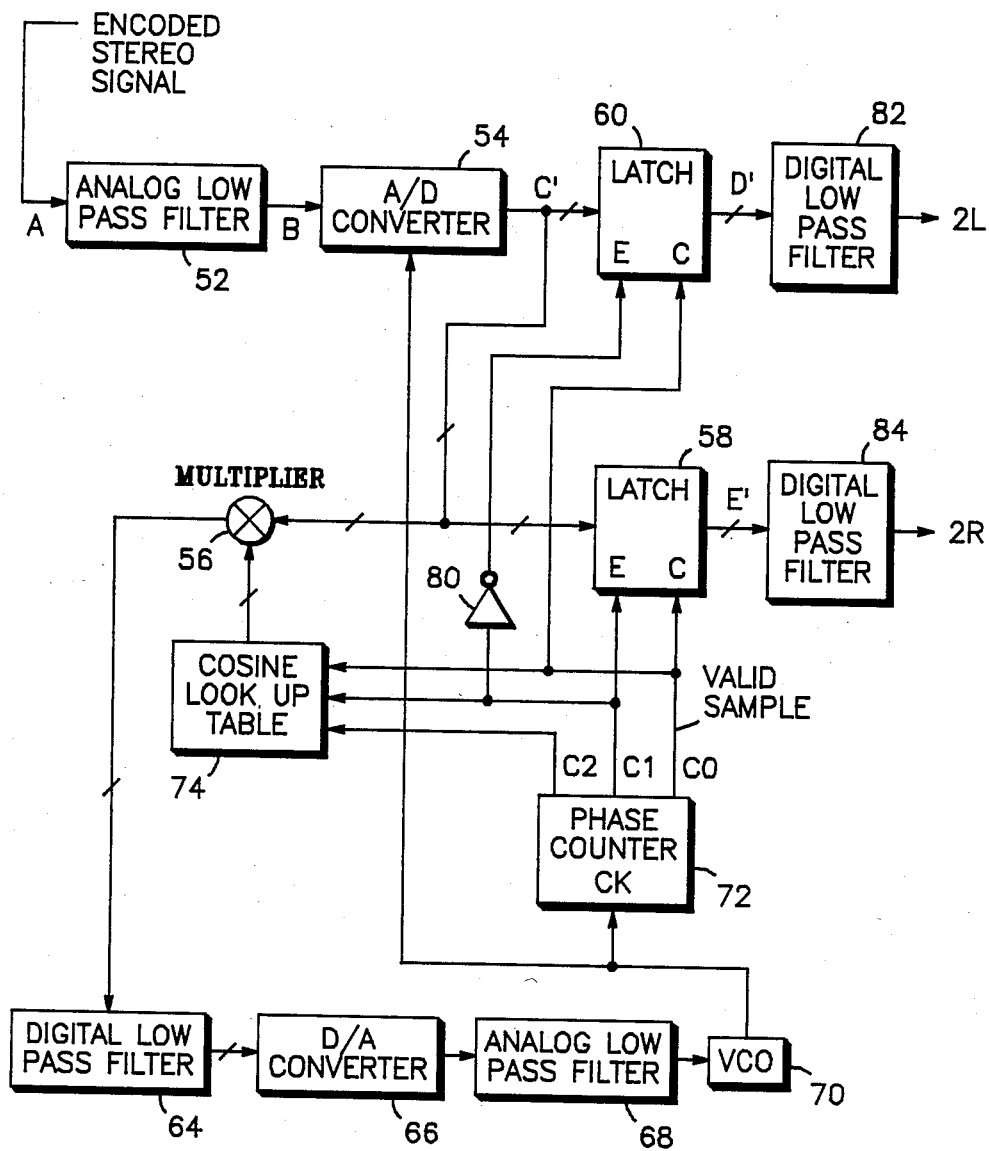
FIG. 4 illustrates in block diagram form a digital implementation of the present invention.

Shown in FIG. 1 is an illustration of an encoded stereo signal spectrum which is transmitted and reconstructed at the output of a conventional FM discriminator circuit in an FM receiver. The encoded signal spectrum occupies the frequency band from zero to about one hundred fifty kilohertz (kHz). As illustrated, the spectrum is occupied by a particular portion of the encoded stereo signal within every nineteen kHz. The sum of the left-hand audio signal and the right-hand audio signal occupies the baseband bandwidth from approximately zero to fifteen kHz. As promulgated at 47 CFR 1.73.322(a), the modulating signal for the main channel in FM stereo sound transmission shall be the sum of the left and right-hand audio signals. Within the same cited section, the U.S. Federal Communications Commission has established a stereo pilot subcarrier to be transmitted at nineteen kHz as shown in FIG. 1. The stereo pilot signal frequency modulates the main carrier within predetermined limits. A difference of the left-hand audio signal and the right-hand audio signal occupies the frequency spectrum from approximately twenty-three kHz to fifty-three kHz. The next two signals in the frequency spectrum illustrated in FIG. 1 may or may not be present in an encoded stereo signal at the output of an FM discriminator. An automotive radio information (ARI) signal, if present, occupies the frequency spectrum around the fifty-seven kHz region, and a sub-carrier authorization (SCA) signal occupies the frequency spectrum from approximately sixty to seventy kHz. Noise may be present in the frequency spectrum in a varying amount above approximately seventy-six kHz. As shown in FIG. 1, the frequency spectrum is symmetric about zero Hz.

Shown in FIG. 2 is a stereo decoder 10 known in the art. The conventional FM encoded signal which is designated by a signal labeled "A" is coupled to an input of a low pass filter circuit 12. An output of lowpass filter circuit 12 is designated by a signal labeled "B". An output terminal of low pass filter circuit 12 is connected to a first input of a mixer circuit 14. A sinusoidal signal equal to (2)sin 2$w_c$t where $w_c$ is equal to 2$\pi$(19 kHz) is connected to a second input of mixer circuit 14. An output of mixer 14 is represented by a signal labeled "C" and is coupled to a first input of a summer circuit 18 and a first input of a summer circuit 19. A second input of each of summer circuits 18 and 19 is connected to the output terminal of low pass filter circuit 12 for receiving signal "B". An output of summer circuit 18 is connected to an input of a low pass filter circuit 22 and provides a signal labeled "D". An output of summer circuit 19 is connected to an input of a low pass filter circuit 24 and provides a signal labeled "E". An output of low pass filter circuit 22 provides a signal labeled "F" which is equal to twice the left-hand audio signal, and an output of low pass filter circuit 24 provides a signal labeled "G" which is equal to twice the right-hand audio signal.

In operation, low pass filter 12 receives the encoded stereo signal and filters undesired components such as ARI, SCA and noise from the signal in the frequency range illustrated in FIG. 1. A typical low pass cutoff frequency for filter 12 is fifty-three kHz. It is also possible for a conventional FM discriminator circuit (not shown) to remove this noise component from the frequency spectrum so that low pass filter 12 is not always present in a conventional FM decoder. Before noise is removed from the FM encoded signal, signal A may be represented as a function of time by the following equation:

$$A(t)=[L(t)+R(t)]+[L(t)-R(t)] \sin 2w_ct+(Ap) \sin w_ct+Aa[1+m(t)] \sin 3w_ct+SCA(t)+n(t). \quad (1)$$

The first term of signal A as defined in equation one represents a sum of the right-hand and left-hand audio signals, and the second term represents a difference of the two audio signals which is double-sideband, suppressed carrier modulated at a 38 kHz center frequency. The third term of signal A is the stereo pilot signal. The fourth term of signal A is the ARI signal mentioned above and the fifth term is the sub-carrier authorization signal (SCA) also previously described. The sixth and last term of equation one represents noise in the spectrum above 76 kHz. These terms are all illustrated in the frequency spectrum of FIG. 1.

After signal A passes thru low pass filter 12, resultant signal B only contains the first three terms of equation one. Therefore, signal B may be represented with respect to time as:

$$B(t)=[L(t)+R(t)]+[L(t)-R(t)] \sin 2w_ct+(Ap) \sin w_ct. \quad (2)$$

Signal B is coupled to mixer circuit 14 which frequency translates the (L−R) difference signal down to baseband frequency to provide signal C. The sinusoidal signal which is coupled to the second input of mixer 14 is known as the FM stereo subcarrier and is a 38 kHz signal. The subcarrier is typically obtained by positioning a bandpass filter around the stereo pilot and doubling the 19 kHz pilot frequency with a frequency doubler circuit. Another method to obtain the 38 kHz FM stereo subcarrier is to couple the stereo pilot to a phase locked loop circuit and double the frequency. The subcarrier is directly mixed with signal B by mixer 14 so that the two signals are effectively multiplied together. Signal C may be represented with respect to time as:

$$C(t)=2 [L(t)+R(t)] \sin 2w_ct+[L(t)-R(t)]-[L(t)-R(t)] \cos 4w_ct+(Ap) \cos w_ct-(Ap) \cos 3w_ct. \quad (3)$$

It should be noted at this point that included in the numerous terms which exist in signal B of equation two is a sum term of the left-hand and right-hand audio signals at baseband frequency. Also, in the numerous terms which exist in signal C of equation three is a difference term of the left-hand and right-hand audio signals at baseband frequency.

As illustrated, time varying signals B and C are connected to summers 18 and 19 which are also known as a stereo matrix. Summer 18 adds signals B and C, whereas summer 19 effects a subtraction of signals B and C. An output of summer 18 provides signal D which is the sum of signals B and C. Signal D may be represented with respect to time as:

$$D(t)=2L(t)+[3L(t)+R(t)] \sin 3w_ct+(Ap) \sin w_ct+(Ap) \cos w_ct-[L(t)-R(t)] \cos 4w_ct-(Ap) \cos 3w_ct. \quad (4)$$

It should be noted that the first term of signal D is the desired left-hand audio signal multiplied by a factor of two. The second term of signal D in equation four is a component at 57 kHz of undesired information. The third and fourth terms are pilot signals having the frequency of 19 kHz. The fifth term is another undesired term having a frequency of 76 kHz. The sixth term is a pilot term located at a frequency of 57 kHz. The second thru sixth terms created by the addition operation are the result of mixing 38 kHz with the encoded stereo signal. Each of the second thru sixth terms in signal D is separated from the left-hand audio signal which is located at the baseband frequency by at least nineteen kHz. Therefore, signal D is coupled thru low pass filter 22 which has a cutoff frequency of approximately fifteen kHz. The output signal F of filter 22 therefore removes all the terms of signal D except 2L(t) which is the desired left-hand audio output signal.

Similarly, summer 19 provides signal E which is the subtraction of signal C from signal B. Signal E may be represented with respect to time as:

$$E(t)=2R(t)-[L(t)+3R(t)] \sin 2w_ct+(Ap) \sin w_ct-(Ap) \cos w_ct+[L(t)-R(t)] \cos 4w_ct+(Ap) \cos 3w_ct. \quad (5)$$

Upon closer review of signal E, it is readily apparent that the first term of equation five is twice the right-hand audio signal at the baseband frequency and the remaining terms are at higher frequencies of at least nineteen or more kHz. In particular, the second term is an undesired signal present at 38 kHz. The third and fourth terms are the in-phase and quadrature versions of the pilot signal at 19 kHz, respectively. The fifth term is an undesired term at 76 kHz. The sixth term is another version of the pilot signal at 57 kHz. Signal E is coupled to low pass filter 24 which has a cutoff frequency of approximately 15 kHz and which removes all the undesired second thru sixth terms to provide signal G which is equal to 2R(t). Therefore, the desired right-hand audio output signal is recovered from the encoded stereo signal.

The previous discussion has explained in detail the conventional method for decoding stereo signals. In equation one, the [L(t)+R(t)] signal is a baseband signal having a predetermined center frequency of zero and the [L(t)−R(t)] signal has a predetermined center frequency of approximately 38 kHz. In conventional frequency division multiplexed systems, the method of recovering the L(t) and R(t) signals by frequency translating the difference term to baseband frequency and by adding and subtracting the sum and difference terms in a stereo matrix operation is common.

Shown in FIG. 3 is a stereo decoder in accordance with the present invention. A conventional encoded signal is represented by a signal labeled "A" and is received at an input of a low pass filter 32. It should be noted that signal A of FIG. 3 is equivalent to signal A of FIG. 2 and is defined in equation one. An output of low pass filter 32 is connected to an input of an analog to digital (A/D) converter 34 and is labeled "B". Signal B of FIG. 3 is equivalent to signal B of FIG. 2. An output of A/D converter 34 is connected to a first input of both a sampler circuit 36 and a sampler circuit 38 and is labeled "C'". A second input of sampler circuit 36 is connected to a sampled signal labeled $$``\sum_{n=-\infty}^{\infty} (X1)\text{'' where } X1 = \delta[t - (2n + \tfrac{1}{2})T] \quad (6)$$

where δ equals the conventional Dirac delta function. In the illustrated form, n is an integer and T equals (1/76,000) second. An output of sampler circuit 36 provides a signal labeled "D'" and is connected to an input of a low pass filter 40. A second input of sampler circuit 38 is connected to a time sampled signal labeled $$``\sum_{n=-\infty}^{\infty} (X2)\text{'' where } X2 = \delta[t - (2n + 3/2)T]. \quad (7)$$

An output of sampler circuit 38 provides a signal labeled "E'" and is connected to an input of a low pass filter 42. An output of low pass filter 40 provides an output signal which is equal to twice the left-hand audio signal and is labeled "F" which is equivalent to signal F of FIG. 2. An output of low pass filter 42 provides an output signal which is equal to twice the right-hand audio signal and is labeled "G" and is equivalent to signal G of FIG. 2.

In operation, low pass filter 32 functions analogously to filter 12 of FIG. 2. Primarily, filter 32 removes undesired signals present at the output of an FM discriminator (not shown) which provides the stereo encoded signal. Sometimes an FM discriminator may filter sufficient noise from the FM encoded signal so that low pass filter 32 is not necessary. Therefore, it should be understood that filter 32 is optional to the operation of the present invention depending upon the noise component of the encoded stereo signal provided by a conventional FM discriminator circuit not shown. The encoded stereo signal is connected to A/D converter 34 which digitizes the encoded signal. It should also be noted that the present invention may be practiced in an analog form to be described below without converting the encoded signal to digital form. In an analog implementation, A/D converter 34 is not utilized. In a digital implementation, when A/D converter 34 is utilized with low pass filter 32, filter 32 also functions as an anti-aliasing filter. The output of filter 32, signal B, has been previously expressed in equation two. For an analog implementation where A/D converter 34 is not present in the circuit, signal C' becomes equivalent to signal B. For a digital implementation which includes A/D converter 34, signal C' is a sampled, quantized version of signal B. In the analog implementation, signal C' is coupled to sampler 36 which effectively multiplies signal C' by an impulse train of frequency 38 kHz which has been phase locked to the 19 kHz pilot frequency in the following relationship:

$$\sum_{n=-\infty}^{\infty} \delta[t - (2n + \tfrac{1}{2})T]. \quad (8)$$

The above expression describes an impulse train or a train of pulses occurring at 38 kHz. In an analog implementation, the impulse train may be approximated by a series of short pulses which are separated by (1/38,000) second in time. In contrast, in a digital implementation, an approximation is not necessary. In other words, the sampling function is implemented by A/D converter 34. Since A/D converter 34 provides a sampled signal, samplers 36 and 38 may be implemented by selecting A/D outputs at an appropriate sampling time. Therefore, in the digital context, the "impulses" are actually unit samples. Thus the impulse input to sampler 36 is the impulse train of equation six and the other input to sampler 36 is the low pass filtered output of the encoded stereo signal spectrum. The output of sampler 36, signal D', is a sampled version of the 2L(t) signal, the left-hand audio signal. In addition, a 19 kHz pilot signal sampled at 38 kHz is also present. This sampling operation is a conventional mathematical function and it can be readily shown applying principles of the sampling theorem that signal D' may be represented with respect to time as:

$$D'(t) = \sum_{n=-\infty}^{\infty} 2L[(2n + \tfrac{1}{2})T]\delta[t - (2n + \tfrac{1}{2})T] + \quad (9)$$

$$\sum_{n=-\infty}^{\infty} Ap(-1)^n \sin(\pi/4)\delta[t - (2n + \tfrac{1}{2})T]$$

where T is equal to (1/76,000) second. If the FM stereo subcarrier is derived externally to decoder 30, the second term of equation nine above is not present. This indicates that the left-hand audio signal is available at the output of sampler 36 by direct time sampling. The above-described sampling is at the predetermined impulse train frequency of 38 kHz which is phase locked to the 19 kHz pilot signal present in the encoded stereo signal. Therefore, a particular phase of the 38 kHz impulse train is utilized to obtain a signal equal to 2L(t) sampled at the 38 kHz rate.

Sampler 38 also utilizes an impulse train to be multiplied with signal C'. In an analog domain, the impulse train may again be ideal impulses or approximation pulses. In the digital domain, the impulse train is comprised of unit samples. It should be noted that the impulse train coupled to sampler 38 defined in equation seven above is exactly one hundred eighty degrees out of phase with the sampling train driving sampler 36. The two inputs to sampler 38 are essentially the encoded stereo spectrum at the output of an FM discriminator (not shown) after filtering by a low pass filter and an impulse train of predetermined phase. The output of sampler 38 is signal E' which may expressed as a function of time as:

$$E'(t) = \sum_{n=-\infty}^{\infty} 2R[(2n + 3/2)T] \delta[t - (2n + 3/2)T] + \sum_{n=-\infty}^{\infty} Ap(-1)^n \sin(\pi/4) \delta[t - (2n + 3/2)T] \quad (10)$$

where T is again equal to (1/76,000) second. Signal E' is a sampled version of twice the right-hand audio signal sampled at 38 kHz. In addition, a 19 kHz pilot signal sampled at 38 kHz may also be present. If the FM stereo subcarrier is derived externally to decoder 30, the second term of equation ten above is not present. This indicates that the right-hand audio signal is available at the output of sampler 36 by direct time sampling. If the input signals to samplers 36 and 38 are provided in analog form, it is necessary to put signals D' and E' thru low pass filters 40 and 42, respectively. Each of the low pass filters 40 and 42 functions to receive a sampled signal and reconstruct or convert the sampled signal back to a continuous time analog signal. If the pilot signal is present in signals D' and E', the pilot signal is removed by low pass filters 40 and 42, respectively. Therefore, low pass filters 40 and 42 are not necessary to the present invention when phase locking to a reference signal other than the pilot signal. Assuming for the purpose of illustration only that an analog implementation is used, signal F is equal to 2L(t) and signal G is equal to 2R(t).

In the illustrated form of the present invention, the left-hand and right-hand audio signals are obtained without performing any matrixing operation between the (L−R) and (L+R) signal channels. Rather, the output signals are obtained directly from the encoded stereo signal. Additionally, it may be noted that samplers 36 and 38 illustrated in FIG. 3 are physically drawn the same as mixer 14 of FIG. 2. This is because a sampler can be implemented as a mixer driven by an ideal impulse train. However, the circuits in FIGS. 2 and 3 operate in very dissimilar ways. Mixer 14 of FIG. 2 functions to perform a frequency translation. In contrast, samplers 36 and 38 of FIG. 3 function to sample. Further, the prior art system of FIG. 2 operates on the principle that the component signals (L+R) and (L−R) are available from the encoded stereo input signal at separate frequencies. By using a frequency domain approach involving frequency translation and matrixing, a separation of the left-hand and right-hand audio signals are possible. In contrast, the present invention operates by direct time sampling of the encoded stereo waveform. By taking a sample of the voltage of the waveform at particular points in time relative to the pilot signal, the signals 2L(t) and 2R(t) are available directly without frequency translation or matrixing operations.

Shown in Table One in the Appendix is a table of values indicating the particular time positions in the encoded stereo input signal that the left-hand and right-hand audio signals are available. Once the pilot signal has been extracted from the encoded signal, the left-hand audio signal is available by directly sampling the encoded signal at 45° and 225° relative to the 19 kHz stereo pilot. Similarly, the right-hand audio signal is available by directly sampling the encoded stereo signal at 135° and 315° relative to the 19 kHz stereo pilot. The sampling of the left-hand audio signal is performed by sampler 36. Depending upon the implementation, the 19 kHz stereo pilot may be present in the signals. These can be removed by low pass filters 40 and 42 or by circuitry not shown. The sampling of the right-hand audio signal is performed by sampler 38. Direct time sampling at the precise time when the predetermined desired signals are isolated in the time waveform makes it possible to avoid the use of frequency translation. Also, in a digital implementation where a stereo pilot is not present at signal C', low pass filters 40 and 42 may be eliminated.

Shown in FIG. 4 is a digital decoder 50 which illustrates the present invention in an all-digital form. The FM encoded signal previously discussed is coupled to an input of an analog low pass filter 52. An output of low pass filter 52 is connected to an input of an A/D converter 54. An output of A/D converter 54 is connected to a first input of a digital multiplier 56 and to both a data input of a latch 58 and a data input of a latch 60. An output of multiplier 56 is connected to an input of a digital low pass filter 64. An output of low pass filter 64 is connected to an input of a D/A converter 66. An output of D/A converter 66 is connected to an input of an analog low pass filter 68. An output of low pass filter 68 is connected to an input of a voltage controlled oscillator (VCO) 70. An output of VCO 70 is connected to both a control input of A/D converter 54 and to a clock input of a phase counter circuit 72. Phase counter 72 provides three single bit outputs labeled "C0", "C1" and "C2". Output C0 is a valid sample signal and is connected to a clock input of each of latches 58 and 60 and to a first input of a cosine lookup table 74 containing predetermined cosine values. Output C1 is connected to an enable input of latch 58, to an input of an inverter 80 and to a second input of cosine lookup table 74. An output of inverter 80 is connected to an enable input of latch 60. Output C2 is connected to a third input of cosine lookup table 74. An output of cosine lookup table 74 is connected to a second input of multiplier 56. An output of latch 60 is connected to an input of a digital low pass filter 82. An output of digital low pass filter 82 provides a signal labeled "2L" which is twice the left-hand audio signal. An output of latch 58 is connected to an input of a digital low pass filter 84. An output of digital low pass filter 84 provides a signal labeled "2R" which is twice the right-hand audio signal.

In operation, the encoded stereo signal is coupled to analog low pass filter 52 which is optional to the invention depending upon whether the ARI, SCA and noise components have been adequately removed by an FM discriminator circuit (not shown). If used as shown in FIG. 4, low pass filter 52 typically has a cutoff frequency of 53 kHz. The filtered encoded stereo signal is digitized by A/D converter 54 and coupled to multiplier 56 and latches 58 and 60. Multiplier 56, digital filter 64, D/A converter 66, analog filter 68, VCO 70, phase counter 72 and lookup table 74 function as a conventional digital phase locked loop circuit. VCO 70 generates a sample clock at the output thereof which is coupled to A/D converter 54. The sample clock indicates the exact time at which A/D converter 54 is to digitize each sample. The nominal frequency of the sample clock is 152 kHz. It should be readily understood that the sample clock signal may be other frequencies which are multiples of 76 kHz above 152 kHz. Such higher frequencies may be desirable to minimize the need for an antialiasing filter function provided by filter 52 and to minimize the analog receiver circuitry (not shown).

In the illustrated form, the sample clock provided by VCO 70 is also coupled to phase counter 72 which is a three bit binary counter. Every time that phase counter 72 receives a clock cycle from VCO 70, phase counter 72 counts up by one position. The outputs C0, C1 and C2 represent a three digit binary number where C0 is the least significant bit. Therefore, eight binary numbers (0 thru 7) may be represented by the three digit output. The phase counter begins with zero and counts up to binary seven before wrapping around to zero again in a modulo fashion. The values of the output of phase counter 72 indicate the phase position of the particular 152 kHz sample present at the output of A/D converter 54 relative to a 19 kHz stereo pilot signal which is being extracted by the phase locked loop.

Referring again to Table One of the Appendix, the value of phase counter 72 is correlated with a particular phase of the output of A/D converter 54 relative to the phase of the 19 kHz stereo pilot signal. For example, a phase counter output of 011 indicates that the A/D converter sample is taken at exactly 135 degrees relative to the phase of the stereo pilot signal. The output of phase counter 72 is coupled to cosine lookup table 74 which provides a digital numeric value representing the value of a cosine wave at 19 kHz. In other words, the output values are the cosine value of the degrees of the 19 kHz pilot signal which the particular sample at the output of A/D converter 54 represents. The 19 kHz cosine signal which is constructed is used by multiplier 56 as a reference in order to extract and phase lock to the frequency and phase of the 19 kHz pilot signal component present in the output of A/D converter 54. The 19 kHz pilot signal is one-half the center frequency, 38 kHz, of the difference component signal formed by the difference of the left-hand and right-hand audio signals. The full value of the center frequency, 38 kHz, may also be used to phase lock to in the event that the 19 kHz pilot signal is not present. It should be apparent that whether the center frequency of the difference component signal or the 19 kHz pilot signal is used to phase lock to is arbitrary. It is only critical that a reference frequency is available for use as a phase lock frequency.

In the illustrated form, multiplier 56 functions to multiply the two input signals which results in mixing the 19 kHz pilot signal down to baseband frequency. The baseband output of multiplier 56 is routed thru low pass filter 64 which removes all undesired components except for pilot information which is located at zero frequency. The output of low pass filter 64 is therefore a low frequency signal. A typical lowpass cutoff frequency of filter 64 is 100 Hz and is provided by way of example only. The output of lowpass filter 64 is an error signal which is used to modify the frequency of VCO 70. Stored in cosine lookup table 74 is a cosine wave which exactly corresponds to the assumed phases that are indicated for phase counter 72 in Table One. By correlating the phase in cosine lookup table 74 exactly with the pilot signal present at the output of A/D converter 54, the output of low pass filter 64 should be exactly zero. Since VCO 70 is illustrated in analog form, D/A converter 66 is required to convert the error signal back to analog form. Analog low pass filter 68 is provided to smooth the output steps of D/A converter 66. A typical cutoff frequency of lowpass filter 68 is one hundred Hz and is provided by way of example only. Therefore, both filter 64 and filter 68 of the phase locked loop function to remove all but low frequency components. The output of low pass filter 68 is used to control the frequency of VCO 70. The phase locked loop causes each A/D converter sample to occur at exactly the position relative to the 19 kHz pilot signal as shown in Table One. The first sample is taken at zero degrees relative to the 19 kHz pilot signal; the second sample is taken at forty-five degrees relative to the pilot signal; the third sample is taken at ninety degrees relative to the pilot signal and so forth. With the samples taken at exactly the precise phase that the right-hand and left-hand audio signals exist, the 2R and 2L signals may be respectively latched by latch circuits 58 and 60. Shown in Table One is the exact phase at which the 2R and 2L signals are directly available. At values of phase counter 72 other than the values illustrated as providing either 2L or 2R, the output of A/D converter 54 contains components which are of no value in the stereo decoding process.

Referring to Table One, an additional significance in output bit C0 may be realized. When bit C0 has a logic one value, a valid sample exists at the output of A/D converter 54. When bit C0 has a logic zero value, a nonvalid sample exists at the output of A/D converter 54. Therefore, bit C0 may be used as a valid sample signal which is coupled to the clock input of latches 58 and 60 for the purpose of clocking the output of A/D converter 54 into one of either latch 58 or latch 60 at the appropriate time. Further, the logic state of bit C1 coincides with whether or not the right-hand or left-hand channels of audio are present at the output of A/D converter 54. Therefore, bit C1 is coupled to the enable input of latch 58 and to the enable input of latch 60 via inverter 80. As a result, latch 58 always latches and provides the right-hand audio signal and latch 60 always latches and provides the left-hand audio signal. Therefore, the input stereo signal has been decoded by direct time sampling of an encoded input signal.

It should be noted that decoder 50 could have been easily implemented with an analog phase locked loop to lock to the stereo pilot signal and would replace the digital phase locked loop previously described. The present invention embodies a method of directly time sampling an encoded stereo input signal and choosing the samples representing two audio components in a stereo transmission.

Although the present invention has been illustrated with a hardware implementation, the invention may also be implemented by software inside a programmable digital signal processor. In such a software implementation, only the A/D and D/A converters and the VCO would be implemented in hardware form. It should be noted that although assigned frequencies in the FM broadcast band may vary depending upon foreign country rules and regulations, the present invention is applicable to decoding any encoded stereo signals comprising a sum component and a difference component regardless of the frequency band. A digital implementation of the present invention has an additional advantage of allowing more precise filtering leading to improved stereo separation and frequency response. Further, the digital implementation the present invention has the advantage of being very precise with respect to temperature variations, and performance will not degrade with age of equipment as may happen to analog circuit components. The method of stereo decoding taught herein is adaptable for use in any stereophonic, monophonic or bilingual receiver and is not limited to FM stereo broadcast applications. For example, the present invention may be utilized in any application which transmits an encoded signal containing two signal components. In such an application, one signal component is proportional to a sum of two separate output signals and the other signal component is proportional to a difference of the output signals. Therefore, provided the sum and difference component signals are present, any type of encoded signal may be decoded by the improved method of this invention to provide two output signals.

While an embodiment has been disclosed using certain assumed parameters, it should be understood that certain obvious modifications to the circuit or the given parameters will become apparent to those skilled in the art, and the scope of the invention should be limited only by the scope of the claims appended hereto.

TABLE One
APPENDIX

| 19 kHz Phase Counter Value | | | A/D Sample C' Phase Relative to 19 kHz Pilot Carrier | A/D Sample C' Information Content | Cosine Lookup Table Data |
| --- | --- | --- | --- | --- | --- |
| C2 | C1 | C0 | | | |
| 0 | 0 | 0 | 0° | — | cos 0° |
| 0 | 0 | 1 | 45° | 2L | cos 45° |
| 0 | 1 | 0 | 90° | — | cos 90° |
| 0 | 1 | 1 | 135° | 2R | cos 135° |
| 1 | 0 | 0 | 180° | — | cos 180° |
| 1 | 0 | 1 | 225° | 2L | cos 225° |
| 1 | 1 | 0 | 270° | — | cos 270° |
| 1 | 1 | 1 | 315° | 2R | cos 315° |

We claim:

1. A decoder for decoding an input signal containing first and second component signals to provide first and second output signals, said first component signal having a first predetermined center frequency and being proportional to a sum of the first and second output signals, and said second component signal having a second predetermined center frequency and being proportional to a difference of the first and second output signals, comprising:

first converter means for receiving the input signal and converting the input signal to a digital signal;

sampling means for direct time sampling the digital signal at predetermined phase relationships relative to a reference frequency and at a predetermined frequency which is phase locked to the reference frequency and providing the first and second output signals in response to the direct time sampling, said sampling means comprising:

latch means coupled to the converter means for latching the digital signal to provide the first and second output signals in response to a control signal; and control means coupled to the converter means and the latch means, for monitoring the phase of the reference frequency with respect to phase of the input signal and providing the control signal at predetermined phase relationships of the input signal and the reference frequency, comprising:

a multiplier for multiplying the digital signal and a predetermined phase factor to provide a phase signal;

first filter means for receiving the phase signal and low pass filtering the phase signal;

second converter means for receiving the filtered phase signal and converting the phase signal to an analog phase signal;

oscillator means coupled to the second converter means for receiving the analog phase signal and providing an oscillating signal in response to a voltage magnitude of the analog phase signal;

counter means coupled to the oscillator means for providing the control signal in response to the oscillating signal; and a lookup table coupled to the counter means, for providing the predetermined phase factor to the multiplier in response to the control signal, said predetermined phase factor being one of a plurality of stored values of the cosine of the phase of the reference frequency.

2. The decoder of claim 1 wherein the reference frequency is equal to the second predetermined center frequency of the second component signal.

3. The decoder of claim 1 wherein the input signal is an FM stereo broadcast signal.

4. The decoder of claim 1 wherein the reference frequency is a stereo pilot signal.

5. A method of decoding an encoded signal to provide first and second output signals, said encoded signal containing first and second component signals, said first component signal having a first predetermined center frequency and being proportional to a sum of the first and second output signals and said second component having a second predetermined center frequency and being proportional to a difference of the first and second output signals, comprising the steps of:

receiving the encoded signal and converting the encoded signal to a digital signal;

multiplying the digital signal by a predetermined phase factor to provide a phase signal;

low pass filtering the phase signal;

converting the filtered phase signal to an analog phase signal;

generating an oscillating signal in response to a voltage magnitude of the analog phase signal;

providing a control signal in response to the oscillating signal, said control signal indicating a phase position of the encoded signal relative to a reference frequency;

storing a plurality of values of the cosine of phases of a reference frequency for use by the multiplier as the phase factor, said phase factor being selected from the stored values in response to the control signal; and providing the first and second output signals in response to the control signal.

6. The method of claim 5 wherein the reference frequency is equal to the second predetermined center frequency of the second component.

7. A decoder for decoding an input signal containing first and second component signals to provide first and second output signals, said first component signal having a first predetermined center frequency and being proportional to a sum of the first and second output signals, and said second component signal having a second predetermined center frequency and being proportional to a difference of the first and second output signals, comprising:

first converter means for receiving the input signal and converting the input signal to a digital signal;

a multiplier for multiplying the digital signal and a predetermined phase factor to provide a phase signal;

first filter means coupled to the multiplier for receiving the phase signal and low pass filtering the phase signal;

second converter means coupled to the first filter means for receiving the filtered phase signal and for converting the filtered phase signal to an analog phase signal;

oscillator means coupled to the second converter means for receiving the analog phase signal and providing an oscillating signal in response to a voltage magnitude of the analog phase signal;

counter means coupled to the oscillator means for providing a control signal in response to the oscillating signal;

storage means coupled to the counter means and to the multiplier, said storage means storing a plurality of stored values of the cosine of the phase of a reference frequency in table form and providing the predetermined phase factor in response to the control signal; and latch means coupled to the first converter means for latching the digital signal to provide the first and second output signals in response to the control signal.

8. The decoder of claim 7 wherein the input signal is an FM stereo broadcast signal.

9. The decoder of claim 7 wherein the reference frequency is a stereo pilot signal.

* * * * *